US009235672B2

(12) United States Patent  (10) Patent No.: US 9,235,672 B2
Yasunaka et al.  (45) Date of Patent: Jan. 12, 2016

(54) HIGH-LEVEL SYNTHESIS DATA GENERATION APPARATUS, HIGH-LEVEL SYNTHESIS APPARATUS, AND HIGH-LEVEL SYNTHESIS DATA GENERATION METHOD

(71) Applicant: SOCIONEXT INC., Yokohama-shi, Kanagawa (JP)

(72) Inventors: Atsushi Yasunaka, Higashiosaka (JP); Kimitoshi Niratsuka, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/466,766

(22) Filed: Aug. 22, 2014

(65) Prior Publication Data

US 2015/0106774 A1  Apr. 16, 2015

(30) Foreign Application Priority Data

Oct. 10, 2013 (JP) .................................. 2013-213145

(51) Int. Cl.
 *G06F 17/50* (2006.01)
(52) U.S. Cl.
 CPC .................................. *G06F 17/505* (2013.01)
(58) Field of Classification Search
 USPC ........................................ 716/102, 104, 106
 See application file for complete search history.

(56) References Cited

U.S. PATENT DOCUMENTS

| | | | |
|---|---|---|---|
| 5,706,205 A * | 1/1998 | Masuda et al. | 716/103 |
| 7,120,903 B2 | 10/2006 | Toi et al. | |
| 7,565,631 B1 * | 7/2009 | Banerjee et al. | 716/103 |
| 7,703,085 B2 | 4/2010 | Poznanovic et al. | |
| 8,458,630 B1 * | 6/2013 | Van Canpenhout | 716/104 |
| 2005/0289499 A1 * | 12/2005 | Ogawa et al. | 716/18 |
| 2008/0040699 A1 * | 2/2008 | Okada | 716/18 |
| 2011/0061032 A1 * | 3/2011 | Kojima | 716/104 |
| 2011/0225557 A1 * | 9/2011 | Fujita | 716/103 |
| 2011/0276929 A1 * | 11/2011 | Imai | 716/102 |
| 2013/0191799 A1 * | 7/2013 | Yasunaka | 716/103 |
| 2013/0254728 A1 * | 9/2013 | Hatae | 716/108 |

FOREIGN PATENT DOCUMENTS

| | | |
|---|---|---|
| JP | 2003-099409 A | 4/2003 |
| JP | 2010-146577 A | 7/2010 |
| JP | 2011-170602 A | 9/2011 |

* cited by examiner

*Primary Examiner* — Brian Ngo
(74) *Attorney, Agent, or Firm* — Arent Fox LLP

(57) ABSTRACT

An analysis unit analyzes a source code representing design data of a semiconductor device, and generates information (CDFG information) indicating the data and control flow of the semiconductor device. A high-level synthesis data generation unit acquires intermediate data (an object file), which is obtained by compiling the source code, generates intermediate data (an object file) by incorporating the CDFG information generated by the analysis unit into the acquired intermediate data, and outputs the generated intermediate data as high-level synthesis data.

7 Claims, 20 Drawing Sheets

```
1   // source code
2   void sample(char *in, char coeff[8], char *out)
3   {
4     int i;
5     int tmp = 0;
6     static char reg[8];
7
8     // shift register
9     shift : for (i = 7; i >= 0; i--) {
10      if (i == 0) {
11        reg[i] = *in;
12      } else {
13        reg[i] = reg[i-1];
14      }
15    }
16
17    // mac unit
18    mac : for (i = 0; i < 8; i++) {
19      tmp += coeff[i] * reg[i];
20    }
21    *out = tmp >> 7;
22  }
23
```

FIG. 6

| ID | Line No. | Label Name | Function Name | Provider-Defined Name | Restriction Information | | |
|---|---|---|---|---|---|---|---|
| | | | | | Setting Item | Default Value | Limit Value |
| — | 2 | — | sample | — | — | — | — |
| — | 9 | shift | — | — | — | — | — |
| — | 18 | mac | — | — | — | — | — |
| ... | ... | ... | ... | ... | ... | ... | ... |

FIG. 7

```
// restriction information
// (label specified)
set hls_top sample
set freqency 100,50,200
set library uc_40nm.lib
set library ff_40nm.lib
set shift unroll 4-8
set mac pipeline 1-4
...
```

FIG. 8

```
// restriction information
// (line number specified)
set hls_top sample
set freqency 100,50,200
set library uc_40nm.lib
set library ff_40nm.lib
set L9 unroll 4-8
set L18 pipeline 1-4
...
```

FIG. 9

| ID | Line No. | Label Name | Function Name | Provider-Defined Name | Restriction Information | | |
|---|---|---|---|---|---|---|---|
| | | | | | Setting Item | Default Value | Limit Value |
| – | – | – | – | operating frequency value | freqency | 100MHz | 50-200Mhz |
| – | – | – | – | unit cell library | library | uc_40nm.lib | core_40nm.lib |
| – | – | – | – | FF library | library | ff_40m.lib | ff_40nm.lib |
| – | 2 | – | sample | top of high-level synthesis object | – | – | – |
| – | 9 | shift | – | loop of shift register | unroll | 8 | 4-8 |
| – | 18 | mac | – | loop of mac unit | pipeline | 1 | 1-4 |
| ... | ... | ... | ... | ... | ... | ... | ... |

FIG. 10

| ID | Line No. | Label Name | Function Name | Provider-Defined Name | Restriction Information | | |
|---|---|---|---|---|---|---|---|
| | | | | | Setting Item | Default Value | Limit Value |
| – | – | – | – | operating frequency value | freqency | 100MHz | 50-200Mhz |
| – | – | – | – | unit cell library | library | uc_40nm.lib | core_40nm.lib |
| – | – | – | – | FF library | library | ff_40m.lib | ff_40nm.lib |
| 0001 | 2 | – | sample | top of high-level synthesis object | – | – | – |
| 0002 | 9 | shift | – | loop of shift register | unroll | 8 | 4-8 |
| 0003 | 18 | mac | – | loop of mac unit | pipeline | 1 | 1-4 |
| ... | ... | ... | ... | ... | ... | ... | ... |

FIG. 13

```
// C source code
int mac(int i, int *x, int *y, int *z)
{
  const int c[] = {1, 3, 5, 7, 11, 13, 17, 19};
  int tmp[8];

tmp[i] = c[i] * x[i];
  z[i] += tmp[i] + y[i];

return 0;
}
```

FIG. 15

```
// assembly code (x86_64) 1/2
        .file   "mac.cpp"
        .section    .text
        .align 2
        .p2align 4,,15
.globl _Z3maciPiS_S_
        .type   _Z3maciPiS_S_, @function
_Z3maciPiS_S_:
.LFB2:
        movslq  %edi,%rdi
        leaq    (%rcx,%rdi,4), %r8
        movl    (%rsi,%rdi,4), %eax
        imull   c.2087(,%rdi,4), %eax
        movl    (%r8), %ecx
        addl    (%rdx,%rdi,4), %ecx
        addl    %eax, %ecx
        movl    %ecx, (%r8)
        ret
.LFE2:
        .size   _Z3maciPiS_S_, .-_Z3maciPiS_S_
.globl __gxx_personality_v0
        .section .rodata
        .align 32
        .type   c.2087, @object
        .size   c.2087, 32
c.2087:
        .long   1
        .long   3
        .long   5
        .long   7
        .long   11
        .long   13
        .long   17
        .long   19
```

```
// assembly code (x86_64) 2/2
        .section .eh_frame,"a",@progbits
.Lframe1:
        .long   .LECIE1-.LSCIE1
.LSCIE1:
        .long   0x0
        .byte   0x1
        .string "zPR"
        .uleb128 0x1
        .sleb128 -8
        .byte   0x10
        .uleb128 0x6
        .byte   0x3
        .long   __gxx_personality_v0
        .byte   0x3
        .byte   0xc
        .uleb128 0x7
        .uleb128 0x8
        .byte   0x90
        .uleb128 0x1
        .align 8
.LECIE1:
.LSFDE1:
        .long   .LEFDE1-.LASFDE1
.LASFDE1:
        .long   .LASFDE1-.Lframe1
        .long   .LFB2
        .long   .LFE2-.LFB2
        .uleb128 0x0
        .align 8
.LEFDE1:
        .ident  "GCC: (GNU) 4.1.2 20080704 "
        .section .note.GNU-stack,"",@progbits
```

```
// assembly code (x86_64)  1/2
        .file    "mac.cpp"
        .section    .text
        .align 2
        .p2align 4,,15
.globl _Z3maciPiS_S_
        .type    _Z3maciPiS_S_, @function
_Z3maciPiS_S_:
.LFB2:
        movslq  %edi,%rdi
        leaq    (%rcx,%rdi,4), %r8
        movl    (%rsi,%rdi,4), %eax
        imull   c.2087(,%rdi,4), %eax
        movl    (%r8), %ecx
        addl    (%rdx,%rdi,4), %ecx
        addl    %eax, %ecx
        movl    %ecx, (%r8)
        ret
.LFE2:
        .size    _Z3maciPiS_S_, .-_Z3maciPiS_S_
.globl __gxx_personality_v0
        .section .rodata
        .align 32
        .type    c.2087, @object
        .size    c.2087, 32
c.2087:
        .long    1
        .long    3
        .long    5
        .long    7
        .long    11
        .long    13
        .long    17
        .long    19
        .section .eh_frame,"a",@progbits
.Lframe1:
        .long    .LECIE1-.LSCIE1
.LSCIE1:
        .long    0x0
        .byte    0x1
        .string  "zPR"
        .uleb128 0x1
        .sleb128 -8
        .byte    0x10
        .uleb128 0x6
        .byte    0x3
```

```
// assembly code (x86_64)  2/2
        .long    __gxx_personality_v0
        .byte    0x3
        .byte    0xc
        .uleb128 0x7
        .uleb128 0x8
        .byte    0x90
        .uleb128 0x1
        .align 8
.LECIE1:
.LSFDE1:
        .long    .LEFDE1-.LASFDE1
.LASFDE1:
        .long    .LASFDE1-.Lframe1
        .long    .LFB2
        .long    .LFE2-.LFB2
        .uleb128 0x0
        .align 8
.LEFDE1:
        .ident   "GCC: (GNU) 4.1.2 20080704 "
        .section .note.GNU-stack,"",@progbits
// .note section for high-level synthesis added
        .section    .note.HLS,"",@note
namesz:
        .long    name_e - name_s
descsz:
        .long    dsec_e - dsec_s
type:
        .long    1
name_s:
        .string "HLS Compiler"
name_e:
        .p2align 2
dsec_s:
        .long    0x11223344
        .long    0x55667788
        .
        .
        .
dsec_e:
        .p2align 2
```

HIGH-LEVEL SYNTHESIS DATA GENERATION APPARATUS, HIGH-LEVEL SYNTHESIS APPARATUS, AND HIGH-LEVEL SYNTHESIS DATA GENERATION METHOD

CROSS-REFERENCE TO RELATED APPLICATION

This application is based upon and claims the benefit of priority of the prior Japanese Patent Application No. 2013-213145, filed on Oct. 10, 2013, the entire contents of which are incorporated herein by reference.

FIELD

The embodiments discussed herein are related to a high-level synthesis data generation apparatus, a high-level synthesis apparatus, and a high-level synthesis data generation method.

BACKGROUND

Recently, integrated circuit density has been growing exponentially every year in accordance with Moore's law, so that circuit designs have become more and more complex. Today, the mainstream of integrated-circuit design is register-transfer level (RTL) design using a hardware description language (HDL). RTL design provides a higher level of design abstraction compared with gate-level design, but it is becoming more difficult to handle the circuit size that is increasing year by year.

Thus, high-level synthesis (also referred to as "high-level design") which provides a still higher level of abstraction than RTL is now increasingly being used. The input languages (for example, high-level languages) that are often used in high-level synthesis are software languages. In particular, C, C++, and SystemC as a class library for hardware description are most often used. There are also other input languages, such as Java (registered trademark), BASIC, assembly language, and the like. In high-level synthesis, other than a high-level language, an HDL such as VHDL (Very High Speed Integrated Circuit (VHSIC) HDL), Verilog HDL, SystemVerilog, and the like is created by referring to constraints and technology libraries.

In high-level synthesis, the provider provides a source code representing design data of a semiconductor device (or a semiconductor circuit) to the user, and the user performs high-level synthesis and simulation based on the source code.

In RTL design using an HDL, the original HDL is not easily reproduced from a netlist generated by logic synthesis. Further, since a mechanism for encrypting as compiler identifiers for HDL is supported, it is possible to directly use the encrypted HDL in RTL simulation and logic synthesis by electronic design automation (EDA) tools. Accordingly, the provider provides a netlist and encrypted HDL to the user, instead of providing non-encrypted HDL describing the design data.

Examples of the related art are disclosed in Japanese Laid-open Patent Publications No. 2003-99409, No. 2011-170602, and No. 2010-146577.

In high-level synthesis, design is made using a software language having a higher level of abstraction than RTL. Therefore, a source code representing the design data is easily readable by humans. In the case of conventional high-level synthesis, such a source code that is easily readable by humans is provided to the user, which might result in the outflow of know-how (intellectual properties) of the provider.

SUMMARY

According to an aspect of the invention, there is provided a high-level synthesis data generation apparatus that includes a processor configured to perform a process including: analyzing a source code that represents design data of a semiconductor device, and generating flow information that indicates a data and control flow of the semiconductor device; and acquiring first intermediate data obtained by compiling the source code, generating second intermediate data by incorporating the generated flow information into the first intermediate data, and outputting the second intermediate data as high-level synthesis data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 illustrates an example of a source code;

FIG. 7 illustrates an example of displayed constraint settable information;

FIG. 8 illustrates an example of restriction information entered by the user;

FIG. 9 illustrates another example of restriction information entered by the user;

FIG. 10 illustrates an example of constraint setting information;

FIG. 13 illustrates an example of constraint setting association information;

FIG. 15 is an example of a source code entered in an intermediate data generation apparatus;

FIG. 17 illustrates an example of an assembly code;

FIG. 18 illustrates an example in which high-level synthesis section information is added;

DESCRIPTION OF EMBODIMENTS

Figure 1:
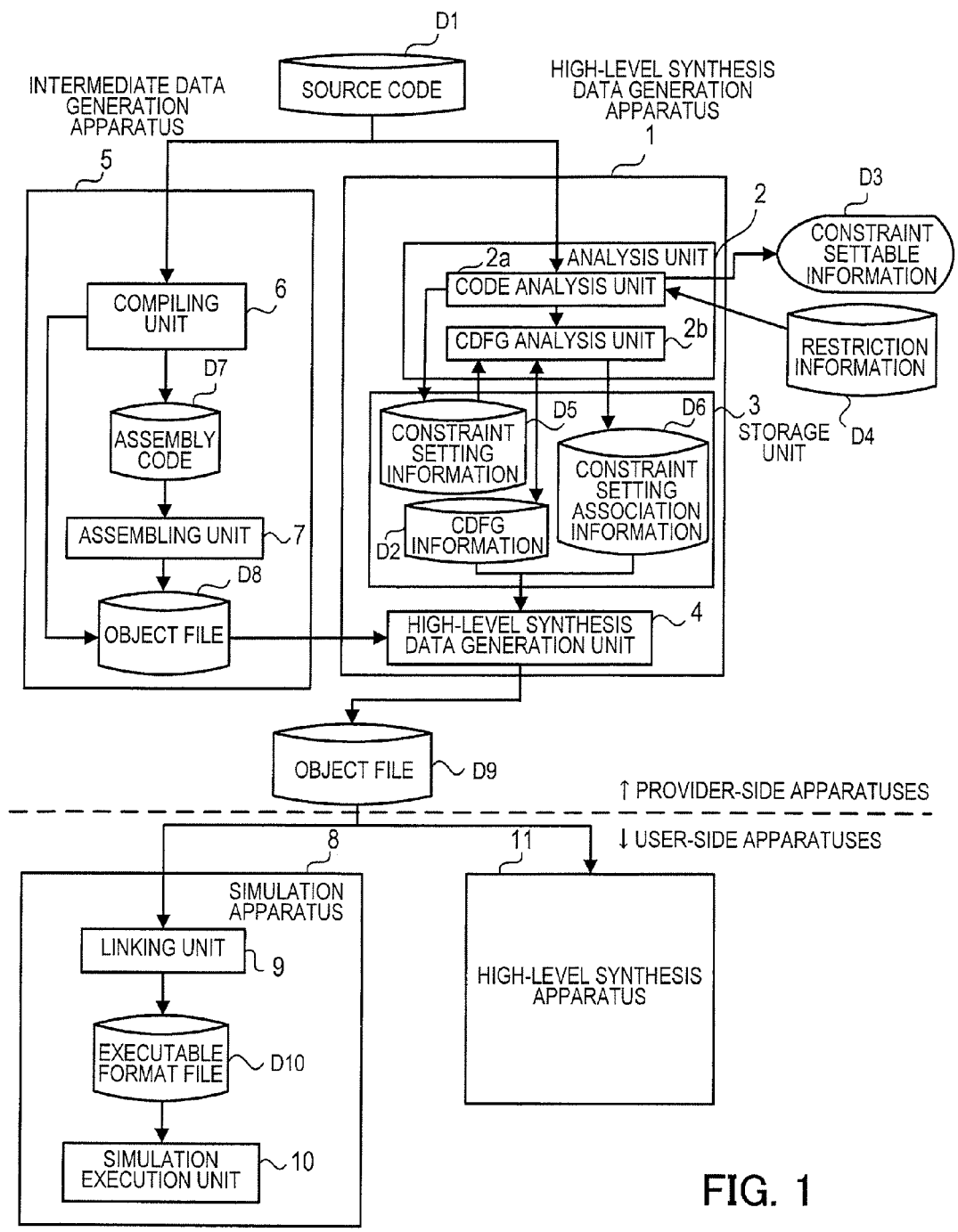
FIG. 1 illustrates an example of a high-level synthesis data generation apparatus and an example of a high-level synthesis apparatus according to an embodiment.

Several embodiments will be described below with reference to the accompanying drawings, wherein like reference numerals refer to like elements throughout.

FIG. 1 illustrates an example of a high-level synthesis data generation apparatus 1 and an example of a high-level synthesis apparatus 11 according to an embodiment.

The high-level synthesis data generation apparatus 1 includes an analysis unit 2, a storage unit 3, and a high-level synthesis data generation unit 4.

The analysis unit 2 analyzes a source code D1 representing design data of a semiconductor device (the term "semiconductor device" as used herein refers also to a semiconductor circuit), and generates information D2 (hereinafter referred to as "control data flow graph (CDFG) information") indicating the data and control flow of the semiconductor device to be designed. The source code D1 is described in a high-level language such as C, C++, SystemC, Java, BASIC, assembly language, and the like. A CDFG is a combination of a data flow graph (DFG) representing the flow of data and a control flow graph (CFG) representing the flow of control, which are created from a behavioral description of the source code D1. An example of CDFG information D2 will be described below (see FIG. 12).

The analysis unit 2 includes a code analysis unit 2a and a CDFG analysis unit 2b. The code analysis unit 2a has a function that analyzes the source code D1, outputs configurable high-level synthesis design information as constraint settable information (design information) D3, and presents the constraint settable information D3 to the provider using the high-level synthesis data generation apparatus 1. Further, the code analysis unit 2a acquires restriction information (design condition information) D4, which is created based on the constraint settable information (design information) D3 by the provider using the high-level synthesis data generation apparatus 1. Then, the code analysis unit 2a generates constraint setting information (design information including design conditions) D5 by adding the restriction information (design condition information) D4 to the constraint settable information (design information) D3, and stores the constraint setting information D5 in the storage unit 3.

The restriction information (design condition information) D4 is information indicating the setting conditions on the constraint settable information (design information) D3, that is, information for restricting the settings, and includes the limit values for various parameters, library information that may be used, and so on.

The CDFG analysis unit 2b generates CDFG information D2 based on the analysis results of the source code D1, and stores the CDFG information D2 in the storage unit 3. Further, the CDFG analysis unit 2b generates constraint setting association information D6 associating the restriction information (design condition information) D4 included in the constraint setting information D5 with the CDFG information D2, and stores the constraint setting association information D6 in the storage unit 3.

The storage unit 3 stores the CDFG information D2, the constraint setting information D5, and the constraint setting association information D6 which are generated by the analysis unit 2.

The high-level synthesis data generation unit 4 acquires intermediate data, which is obtained by compiling the source code D1, generates intermediate data by incorporating the CDFG information D2 and the constraint setting association information D6 into the acquired intermediate data, and outputs the generated intermediate data as high-level synthesis data.

In the example of FIG. 1, the source code D1 is converted into an assembly code D7 by a compiling unit 6 of an intermediate data generation apparatus 5, and the assembly code D7 is converted into an object file D8 by an assembling unit 7. The high-level synthesis data generation unit 4 of the high-level synthesis data generation apparatus 1 acquires the object file D8 as intermediate data, and outputs, as high-level synthesis data, an object file D9 including the CDFG information D2 and the constraint setting association information D6.

The high-level synthesis data generated by provider-side apparatuses (the high-level synthesis data generation apparatus 1 and the intermediate data generation apparatus 5 in the example of FIG. 1), which are apparatuses used by the provider of high-level synthesis data, is provided to user-side apparatuses. The user-side apparatuses include a simulation apparatus 8 and the high-level synthesis apparatus 11.

With the high-level synthesis data generation apparatus 1 described above, the intermediate data (object file D9) including the CDFG information D2 is provided as high-level synthesis data to the user-side apparatuses, in place of the source code D1. It is difficult to extract the source code D1 from the object file D9 and CDFG information D2, and therefore the confidentiality of the source code D1 is protected. This makes it possible to prevent outflow of know-how.

Further, since the constraint setting association information D6 associating the restriction information (design condition information) D4 with the CDFG information D2 is included in the object file D8, the user-side apparatuses are able to easily determine what high-level synthesis constraint may be set for the elements of the CDFG information D2.

Further, the high-level synthesis data generation apparatus 1 is able to provide the CDFG information D2 and the constraint setting association information D6 to the user-side apparatuses, by providing a single object file D9.

The following describes examples of user-side apparatuses.

(Examples of User-Side Apparatuses)

As illustrated in FIG. 1, the simulation apparatus 8 includes a linking unit 9 that acquires the object file D9, which is high-level synthesis data, and generates an executable format file D10. A simulation execution unit 10 executes simulation by executing the executable format file D10, and determines whether operations intended by the user are performed. As will be described below, the CDFG information D2 and the constraint setting association information D6 included in the object file D9 do not affect the processing by the linking unit 9.

The following describes an example of the high-level synthesis apparatus 11.

Figure 2:
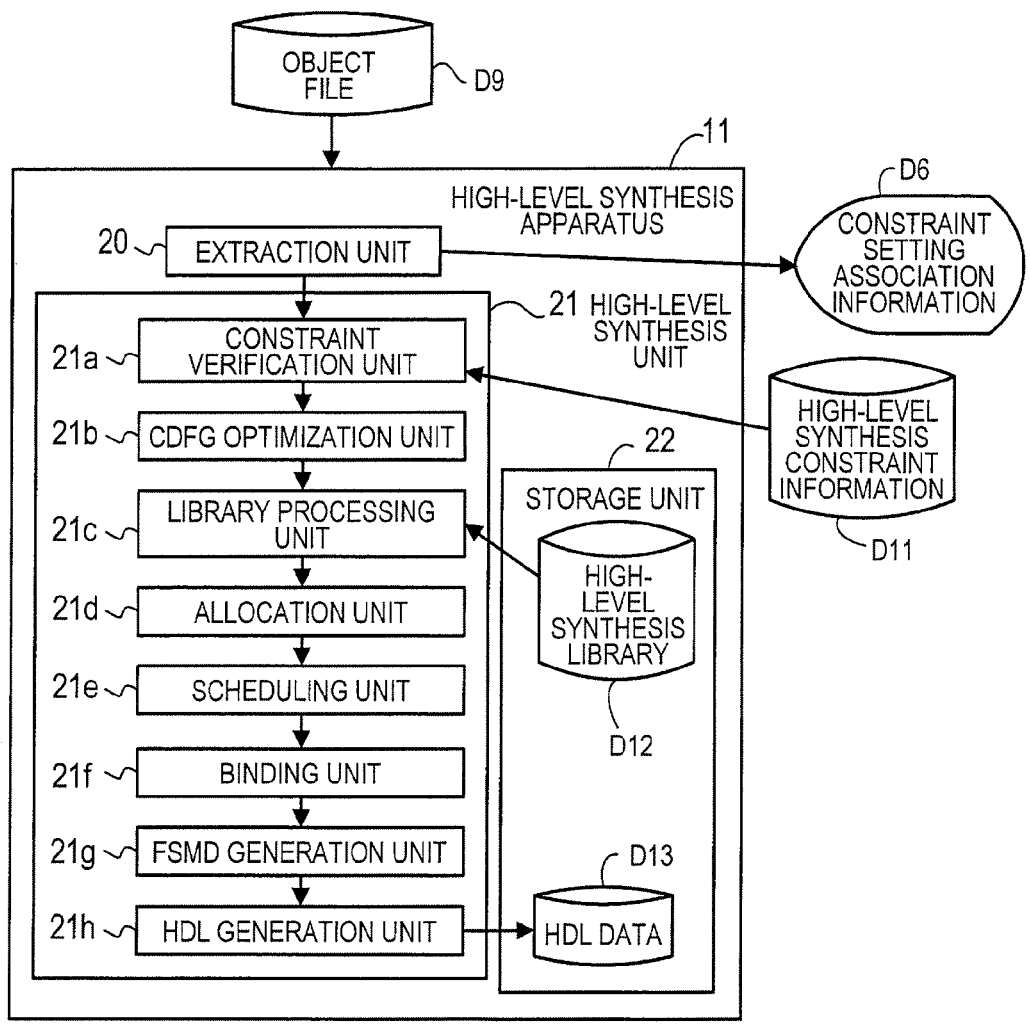
FIG. 2 illustrates an example of a high-level synthesis apparatus.

FIG. 2 illustrates an example of the high-level synthesis apparatus 11.

The high-level synthesis apparatus 11 includes an extraction unit 20, a high-level synthesis unit 21, and a storage unit 22.

The extraction unit 20 extracts CDFG information D2 and constraint setting association information D6 from intermediate data (object file D9) provided as high-level synthesis data. Further, the extraction unit 20 outputs the extracted constraint setting association information D6, and presents the constraint setting association information D6 to the user of the high-level synthesis apparatus 11. The user creates high-level synthesis constraint information (high-level synthesis design information) D11 based on the constraint setting association information D6, and enters the high-level synthesis constraint information D11 to the high-level synthesis apparatus 11.

The high-level synthesis unit 21 performs high-level synthesis based on the CDFG information D2 extracted by the extraction unit 20. The high-level synthesis unit 21 includes a constraint verification unit 21a, a CDFG optimization unit 21b, a library processing unit 21c, an allocation unit 21d, a scheduling unit 21e, a binding unit 21f, a Finite State Machine with Datapath (FSMD) generation unit 21g, and an HDL generation unit 21h.

The constraint verification unit 21a acquires high-level synthesis constraint information (high-level synthesis design information) D11, and verifies whether the high-level synthesis constraint information (high-level synthesis design information) D11 created by the user satisfies restrictions defined by the restriction information (design condition information) D4 included in the constraint setting association information D6. Then, if the high-level synthesis constraint information (high-level synthesis design information) D11 does not satisfy the restrictions, the constraint verification unit 21a issues an alert, and restricts execution of high-level synthesis.

The CDFG optimization unit 21b optimizes the CDFG information D2 extracted by the extraction unit 20, if the constraint verification unit 21a determines that the high-level synthesis constraint information (high-level synthesis design information) D11 is approved. For example, the CDFG optimization unit 21b performs optimization by consolidating redundant multiplications, if any, and by combining variables into a common variable where appropriate.

The library processing unit 21c acquires timing information and area information from a high-level synthesis library D12 stored in the storage unit 22.

The allocation unit 21d maps information on operations such as addition, multiplication, and so on.

The scheduling unit 21e determines the execution steps of operations and array access in accordance with the timing information.

The binding unit 21f assigns operators, variables, and arrays to an arithmetic unit, a register, and a memory.

The FSMD generation unit 21g generates a state machine.

The HDL generation unit 21h converts the architecture of the synthesized circuit into HDL data D13 at a register-transfer level, and stores the HDL data D13 in the storage unit 22.

With the high-level synthesis apparatus 11 described above, it is possible to perform high-level synthesis based on the CDFG information D2 included in the object file D9. Further, the constraint setting association information D6 included in the object file D9 is output and presented to the user. This allows the user to easily determine what high-level synthesis constraint may be set for the elements of the CDFG information D2. Further, if the high-level synthesis constraint information (high-level synthesis design information) D11 entered by the user does not satisfy the restrictions defined by the restriction information (design condition information) D4, which is set by the provider, the constraint verification unit 21a issues an alert, and restricts execution of high-level synthesis. This prevents high-level synthesis from being performed with settings not intended by the provider.

The high-level synthesis data generation apparatus 1 as a provider-side apparatus may have the functions of the high-level synthesis apparatus 11. Similarly, the intermediate data generation apparatus 5 may have the functions of the simulation apparatus 8.

The following describes examples of the high-level synthesis data generation apparatus 1 and the high-level synthesis apparatus 11 in greater detail.

(Example of Hardware)

Figure 3:
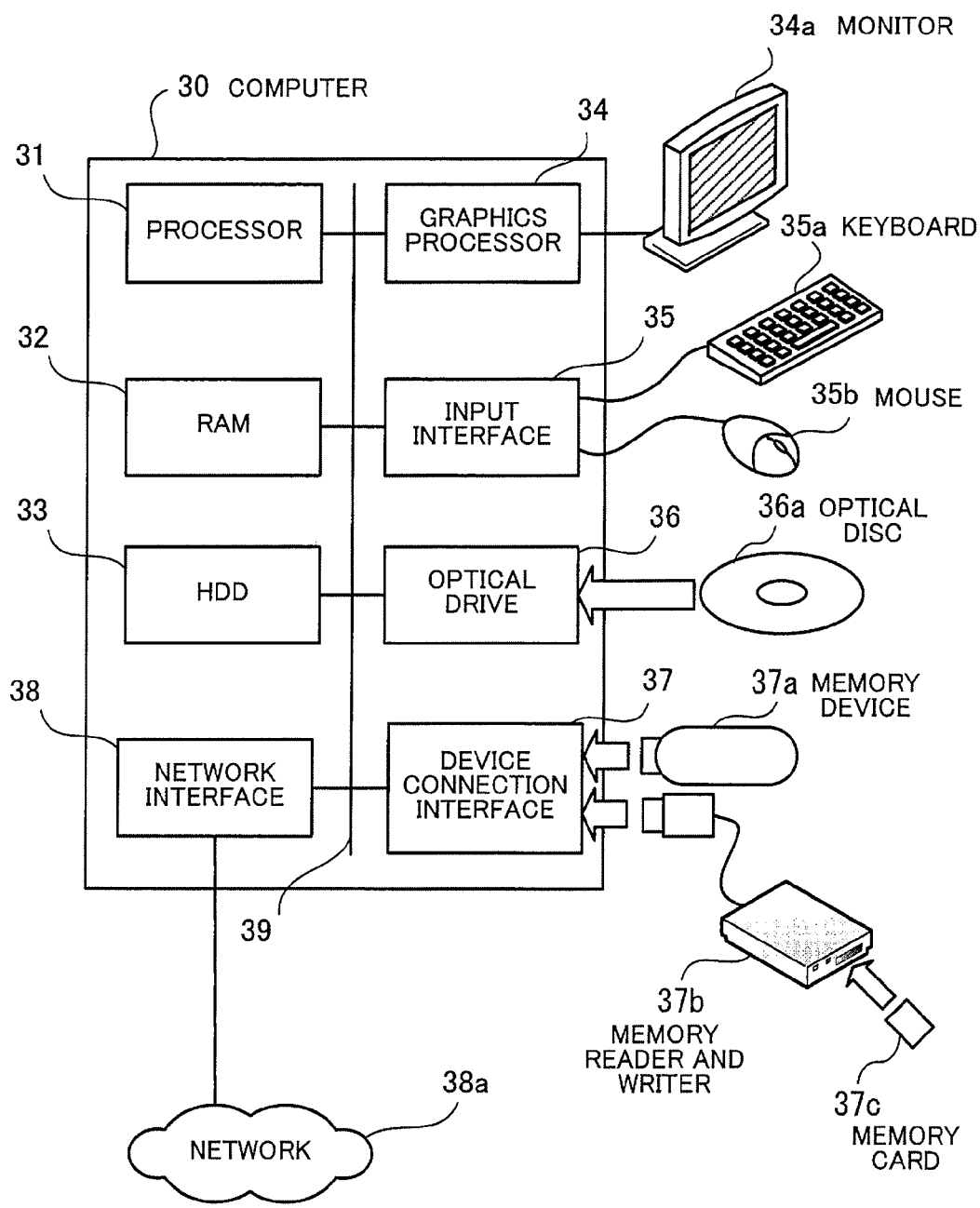
FIG. 3 illustrates an example of hardware of the high-level synthesis data generation apparatus or the high-level synthesis apparatus.

FIG. 3 illustrates an example of hardware of the high-level synthesis data generation apparatus 1 or the high-level synthesis apparatus 11.

The high-level synthesis data generation apparatus 1 or the high-level synthesis apparatus 11 is implemented as a computer 30 illustrated in FIG. 3. The intermediate data generation apparatus 5 and the simulation apparatus 8 may be implemented as similar hardware.

The entire operation of the computer 30 is controlled by a processor 31. A random access memory (RAM) 32 and a plurality of peripheral devices are connected to the processor 31 via a bus 39. The processor 31 may be a multiprocessor. Examples of the processor 31 include central processing unit (CPU), micro processing unit (MPU), digital signal processor (DSP), application specific integrated circuit (ASIC), programmable logic device (PLD), and the like. Alternatively, the processor 31 may be a combination of two or more of the devices selected from CPU, MPU, DSP, ASIC, and PLD.

The RAM 32 serves as a primary storage device of the computer 30. The RAM 32 temporarily stores at least part of the operating system (OS) program and application programs that are executed by the processor 31. The RAM 32 also stores various types of data used for processing by the processor 31.

The peripheral devices connected to the bus 39 include a hard disk drive (HDD) 33, a graphics processor 34, an input interface 35, an optical drive 36, a device connection interface 37, and a network interface 38.

The HDD 33 magnetically writes data to and reads data from its internal disk. The HDD 33 serves as a secondary storage device of the computer 30. The HDD 33 stores the OS program, application programs, and various types of data. Note that a semiconductor storage device such as a flash memory and the like may be used as a secondary storage device.

A monitor 34a is connected to the graphics processor 34. The graphics processor 34 displays an image on the screen of the monitor 34a in accordance with an instruction from the processor 31. Examples of the monitor 34a include display devices using a cathode ray tube (CRT), liquid crystal display devices, and the like.

A keyboard 35a and a mouse 35b are connected to the input interface 35. The input interface 35 receives signals from the keyboard 35a and the mouse 35b, and transmits the received signals to the processor 31. Note that the mouse 35b is an example of a pointing device, and other types of pointing devices may also be used. Examples of other types of pointing devices include touch panels, tablets, touch pads, track balls, and the like.

The optical drive 36 reads data from an optical disc 36a, using laser beams or the like. The optical disc 36a is a portable storage medium storing data such that the data may be read using optical reflection. Examples of the optical disc 36a include digital versatile disc (DVD), DVD-RAM, compact disc read only memory (CD-ROM), CD-Recordable (CD-R), CD-Rewritable (CD-RW), and the like.

The device connection interface 37 is a communication interface that connects peripheral devices to the computer 30. For example, a memory device 37a and a memory reader and writer 37b may be connected to the device connection interface 37. The memory device 37a is a recording medium having a function to communicate with the device connection interface 37. The memory reader and writer 37b is a device that writes data to and reads data from a memory card 37c. The memory card 37c is a card-type recording medium.

The network interface 38 is connected to a network 38a. The network interface 38 exchanges data with other computers or communication apparatuses via the network 38a.

With the hardware configuration described above, it is possible to realize the processing functions of the high-level synthesis data generation apparatus 1 of FIG. 1 or the high-level synthesis apparatus 11 of FIG. 2. For example, the processing functions of the analysis unit 2 and the high-level synthesis data generation unit 4 of the high-level synthesis data generation apparatus 1 of FIG. 1 or the processing functions of the extraction unit 20 and the high-level synthesis unit 21 of FIG. 2 are realized under the control of the processor 31.

The computer 30 realizes the processing functions of the high-level synthesis data generation apparatus 1 or the high-level synthesis apparatus 11 by executing a program stored in a computer-readable recording medium, for example. The program describing the procedure to be performed by the computer 30 may be stored in various recording media. For example, the program to be executed by the computer 30 may be stored in the HDD 33. The processor 31 loads at least part of the program from the HDD 33 into the RAM 32 so as to execute the program. The program to be executed by the computer 30 may also be stored in a portable recording medium, such as the optical disc 36a, the memory device 37a, the memory card 37c, and the like. The program stored in the portable recording medium may be executed after being installed into the HDD 33 under the control of, for example, the processor 31. Further, the processor 31 may execute the program by reading the program directly from the portable recording medium.

In the following, processing by the high-level synthesis data generation apparatus 1 will be described in greater detail in terms of a specific example.

(Example of Processing by High-Level Synthesis Data Generation Apparatus 1)

Figure 4:
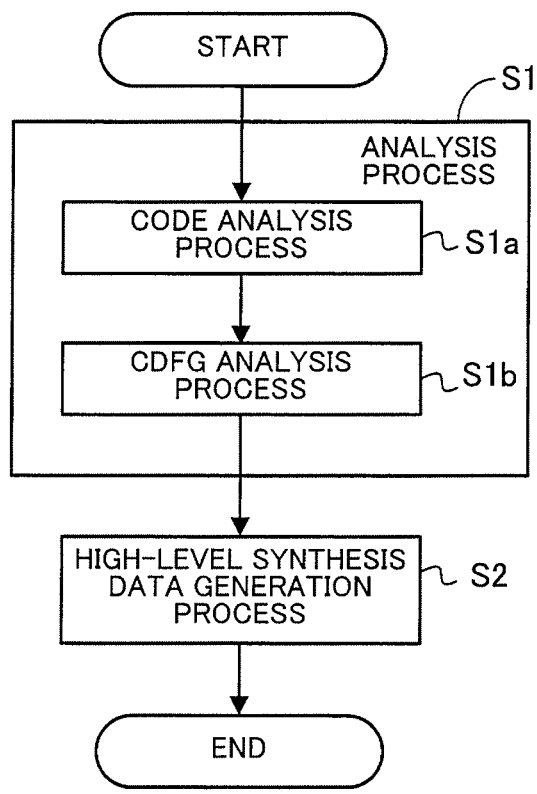
FIG. 4 is a flowchart illustrating the flow of processing by the high-level synthesis data generation apparatus.

FIG. 4 is a flowchart illustrating the flow of processing by the high-level synthesis data generation apparatus 1.

The high-level synthesis data generation apparatus 1 performs an analysis process (step S1) and a high-level synthesis data generation process (step S2).

In the analysis process, the code analysis unit 2a first performs a code analysis process (step S1a), and then the CDFG analysis unit 2b performs a CDFG analysis process (step S1b).

Figure 5:
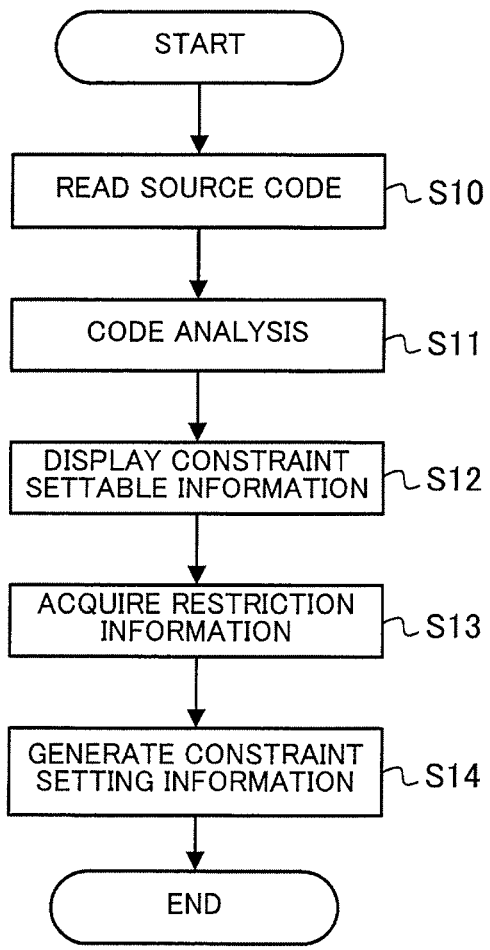
FIG. 5 is a flowchart illustrating the flow of an example of a code analysis process.

FIG. 5 is a flowchart illustrating the flow of an example of a code analysis process.

In the code analysis process, a source code D1 is first read (step S10), and then a code analysis is performed (step S11).

FIG. 6 illustrates an example of the source code D1.

In the example of the source code D1 of FIG. 6, a semiconductor device including a shift register and a multiply and accumulate unit is described. Lines 8 to 15 describe the shift register, and lines 17 to 22 describe the multiply and accumulate unit.

In the processing of step S11, the code analysis unit 2a extracts parts where constraints may be set in high-level synthesis, such as for statements, if statements, and the like, from the description of the source code D1.

Then, the extracted information is displayed as constraint settable information (design information) D3 on, for example, the monitor 34a of FIG. 3 (step S12).

FIG. 7 illustrates an example of displayed constraint settable information D3.

A table illustrated in FIG. 7 includes the identifier (ID) (described below) of each element of CDFG information D2, the line number in the source code D1, the label name, the function name, the provider-defined name, and restriction information (design condition information: setting item, default value, and limit value). According to the table, the source code D1 of FIG. 6 includes, as the constraint settable information (design information) D3, information on the function name "sample" on line 2, information on the label name "shift" on line 9, and information on the label name "mac" on line 18.

After the processing of step S12, the code analysis unit 2a acquires restriction information (design condition information) D4 entered by the user (step S13). The code analysis unit 2a acquires restriction information (design condition information) D4 which is created, for example, by the user in the form of a file in the manner described below.

FIG. 8 illustrates an example of the restriction information D4 entered by the user.

In the example of the restriction information (design condition information) D4 of FIG. 8, the setting value of parallelization in a loop statement of the label "shift" on line 9 in the source code D1 is to be set to 4 to 8. Further, the setting value of pipelines in a loop statement of the label "mac" on line 18 in the source code D1 is to be set to 1 to 4.

As illustrated in FIG. 8, the restriction information (design condition information) D4 includes not only the items illustrated as the constraint settable information (design information) D3, but also the value of the operating frequency of the semiconductor device, names of libraries that may be used, and so on. In the example of FIG. 8, the operating frequency is to be set to 100 MHz by default, and may be set in a range from 50 to 200 MHz.

By placing these restrictions, it becomes possible to prevent high-level synthesis from being performed at the user side with the settings not intended by the provider. For example, in the case where optimization is performed with a specific library and an operating frequency in a given range, it becomes possible to more appropriately perform optimization by placing a restriction that prevents the settings specifying other libraries and an operating frequency out of that range from being made.

FIG. 9 illustrates another example of the restriction information D4 entered by the user.

In FIG. 9, in place of the label names such as "shift" and "mac", the line number of the line in the source code D1 to be configured is specified. "L9" and "L18" in FIG. 9 indicate line 9 and line 18. The content of settings to be made is the same as the content illustrated in FIG. 8.

As illustrated in FIG. 9, in the restriction information (design condition information) D4, the part to be configured may be indicated not by the label, but by the line number.

Note that the user may enter a setting item, a default value, a limit value, and so on in a table as illustrated in FIG. 7, which is displayed on the monitor 34a, and the code analysis unit 2a may acquire these pieces of information as restriction information (design condition information) D4. Further, the user may write the "provider-defined name" for each setting item, as illustrated in FIG. 10.

Then, the code analysis unit 2a generates constraint setting information D5, based on the acquired restriction information (design condition information) D4 (step S14).

FIG. 10 illustrates an example of the constraint setting information D5.

The constraint setting information D5 of FIG. includes the constraint settable information (design information) D3 of FIG. 7 that is updated based on the restriction information (design condition information) D4, and thus includes the content specified by the restriction information (design condition information) D4 of FIG. 8 and FIG. 9. Further, the constraint setting information D5 includes the "provider-defined name" for each setting item.

Then, a CDFG analysis process is performed.

Figure 11:
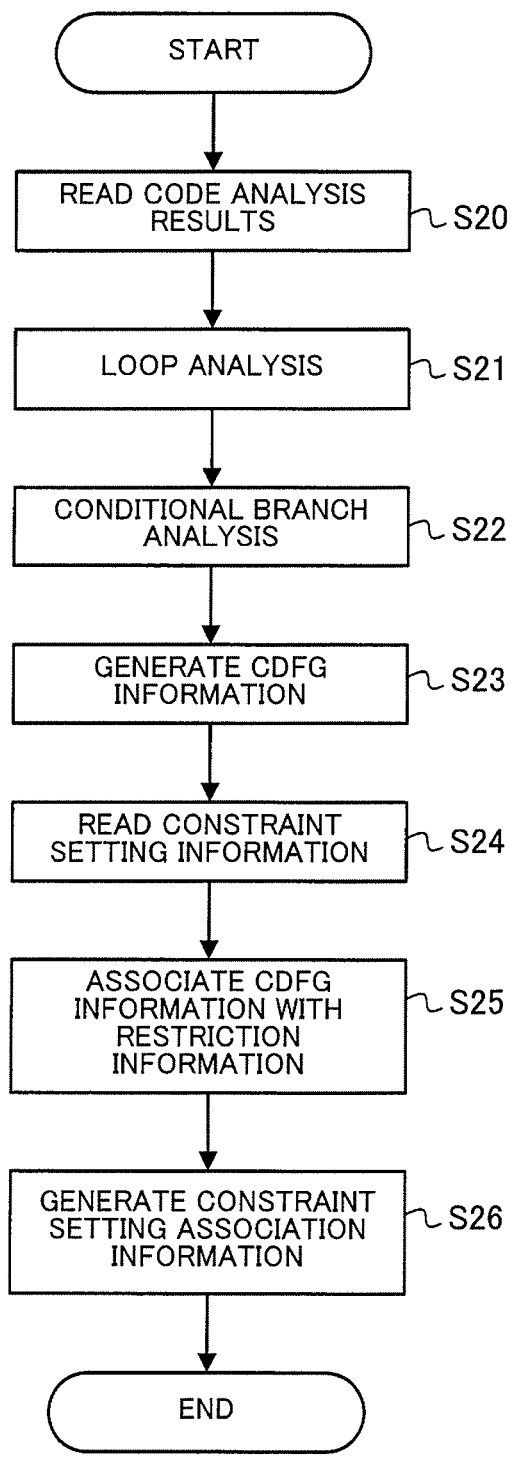
FIG. 11 is a flowchart illustrating the flow of an example of a CDFG analysis process.

FIG. 11 is a flowchart illustrating the flow of an example of a CDFG analysis process.

The CDFG analysis unit 2b reads the results of the code analysis by the code analysis unit 2a (step S20), performs a loop analysis (step S21) and a conditional branch analysis (step S22), and generates CDFG information D2 (step S23). Note that steps S21 and S22 may be performed in any order.

Figure 12:
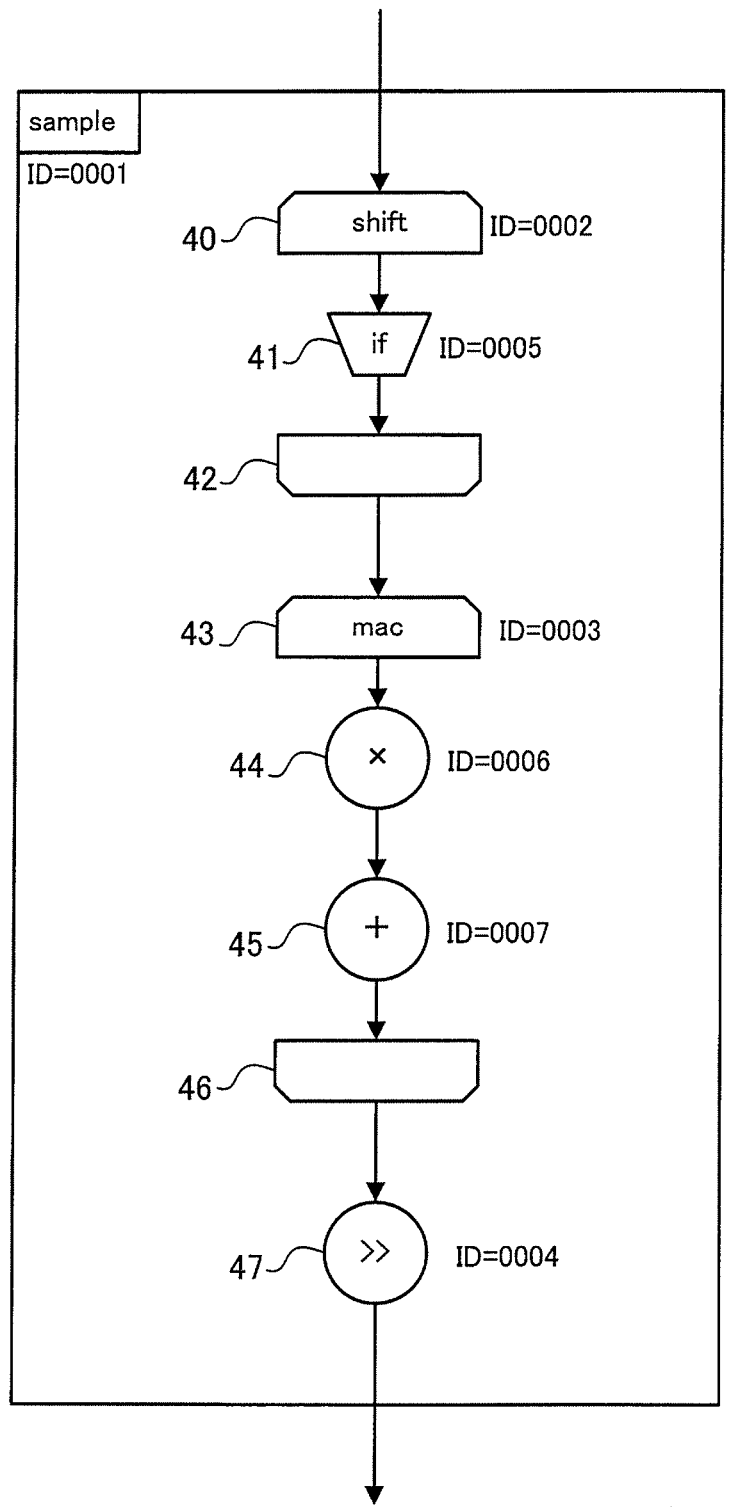
FIG. 12 illustrates an example of CDFG information.

FIG. 12 illustrates an example of the CDFG information D2.

A function called "sample" in the source code D1 of FIG. 6 is represented by a CDFG.

Each of parts 40 and 43 represents the start of a loop, and each of parts 42 and 46 represents the end of a loop. The parts 40 and 42 form a loop of "shift", and the parts 43 and 46 form a loop of "mac". Further, a part represents "if" (conditional branch); a part 44 represents multiplication; a part 45 represents addition; and a part 47 represents shift.

After the processing of step S23, the CDFG analysis unit 2b reads the constraint setting information D5 (step S24), and associates the CDFG information D2 with restriction information (design condition information) D4 included in the constraint setting information D5 (step S25).

In the processing of step S25, as illustrated in FIG. 12, the CDFG analysis unit 2b assigns an ID to each of the elements (the parts 40, 41, 43 through 45, and 47) of the CDFG, and thereby associates the elements with the restriction information (design condition information) D4. In the example of FIG. 12, the function "sample" is also regarded as one of the parts, and therefore is assigned with "ID=0001".

In the processing of step S25, such IDs are associated with the restriction information (design condition information) D4.

The code analysis unit 2a generates constraint setting association information D6, based on the results of association between the CDFG information D2 and the restriction information (design condition information) D4 (step S26).

FIG. 13 illustrates an example of the constraint setting association information D6.

The constraint setting association information D6 of FIG. 13 includes the constraint setting information D5 of FIG. 10 that is updated based on the processing of step S25. The IDs of the parts of the CDFG of FIG. 12 are assigned to the corresponding elements of the constraint setting information D5 of FIG. 10.

After completion of the processing by the analysis unit 2 described above, the high-level synthesis data generation unit 4 performs a high-level synthesis data generation process.

Figure 14:
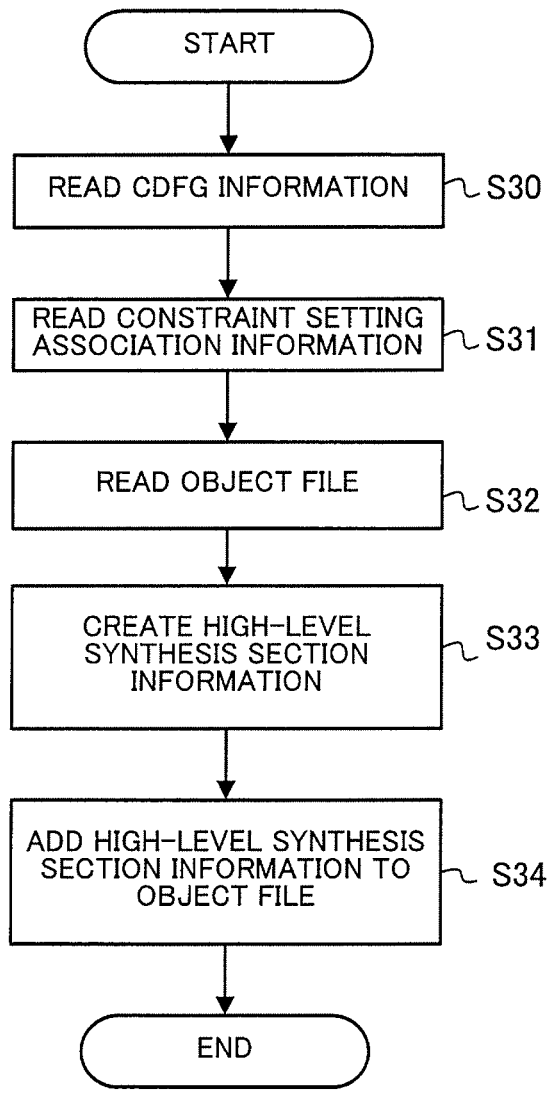
FIG. 14 is a flowchart illustrating the flow of an example of a high-level synthesis data generation process.

FIG. 14 is a flowchart illustrating the flow of an example of a high-level synthesis data generation process.

The high-level synthesis data generation unit 4 reads the CDFG information D2, the constraint setting association information D6, and the object file D8 generated by the intermediate data generation apparatus 5 (steps S30, S31, and S32), and creates high-level synthesis section information (step S33). Note that steps S30 through S32 may be performed in any order.

The following briefly describes an example of generation of an object file D8 by the intermediate data generation apparatus 5.

FIG. 15 is an example of a source code entered in the intermediate data generation apparatus 5.

In FIG. 15, a simple source code having one function called "mac" that performs multiply and accumulate operations is illustrated for explanation purposes. By compiling such a source code with the compiling unit 6, an assembly code D7 is obtained. Then, the assembling unit 7 converts the assembly code D7 into an object file D8. In the following description, it is assumed that Executable and Linking Format (ELF) is used as a file format for the assembly code D7 and the object file D8.

Figure 16:
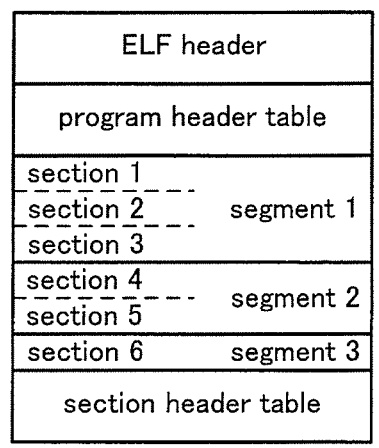
FIG. 16 illustrates an example of the structure of ELF.

FIG. 16 illustrates an example of the structure of ELF.

ELF includes an ELF header, a program header table, and a section header table. In ELF, data is basically handled in units of sections. Typical sections include a ".text" segment where a program is stored, a ".data segment" where data is stored, a ".rodata" segment where read-only constants are stored, and so on. In ELF, there is also a ".note" section where complementary information that may be added by user is stored.

For example, in the format of FIG. 16, a segment 1 including sections 1 through 3 is a ".text" segment, and a segment 2 including sections 4 and 5 is a ".data" segment. Further, a segment 3 including a section 6 is a ".note" section.

FIG. 17 illustrates an example of an assembly code.

More specifically, FIG. 17 illustrates an example of an assembly code obtained by compiling the source code of FIG. 15.

Codes and data are located in appropriate segments. In the example of FIG. 17, the assembly code includes an ".eh_frame" segment, other than the ".text" segment and the ".rodata" segment described above. The assembly code further includes a ".note" section at the end.

Although the object file D8 read by the high-level synthesis data generation unit 4 in the processing of step S32 is one that is obtained by converting the assembly code D7 of FIG. 17 into a binary form, the object file D8 has the same format (ELF) as that illustrated in FIG. 17.

The high-level synthesis section information created in step S33 is based on the CDFG information D2 and the constraint setting association information D6, and is added to the ".note" section in the processing of the following step S34.

In the processing of step S34, the high-level synthesis data generation unit 4 generates an object file D9 by adding high-level synthesis section information to the ".note" section of the object file D8.

FIG. 18 illustrates an example in which high-level synthesis section information is added.

In the example of FIG. 18, high-level synthesis section information is added to the assembly code of FIG. 17 for purposes of simplicity of illustration. In reality, however, high-level synthesis section information is added to the ".note" section of the object file D8.

In the example of FIG. 18, in the ".note" section, a section is defined with the name "HLS", which is an identifier for indicating that the section is for high-level synthesis. Further, in the section for high-level synthesis, the line following a label "namesz" defines the size of a character string described in "name_s". The line following a label "descsz" defines the size of data described in "dsec_s". The line following a label "name_s" defines an arbitrary character string. In the example of FIG. 18, the name of a high-level synthesis tool "HLS Compiler" is defined. The line following a label "dsec_s" defines information that may be arbitrarily added by the user. In the example of FIG. 18, CDFG information and constraint setting association information are added as data.

As described above, the high-level synthesis data generation unit 4 adds the CDFG information D2 and the constraint setting association information D6 to a section to which the user may add information, in the object file. Therefore, it is possible to provide high-level synthesis data in a single file to the user-side apparatuses. Note that since the ".note" section does not affect a linking operation by the linking unit 9 of the simulation apparatus 8, it is possible to create the executable format file D10 without any problem. Accordingly, an existing apparatus may be used as the simulation apparatus 8 without making any special changes.

The following describes an example of processing by the high-level synthesis apparatus 11.

(Example of Processing by High-Level Synthesis Apparatus 11)

Figure 19:
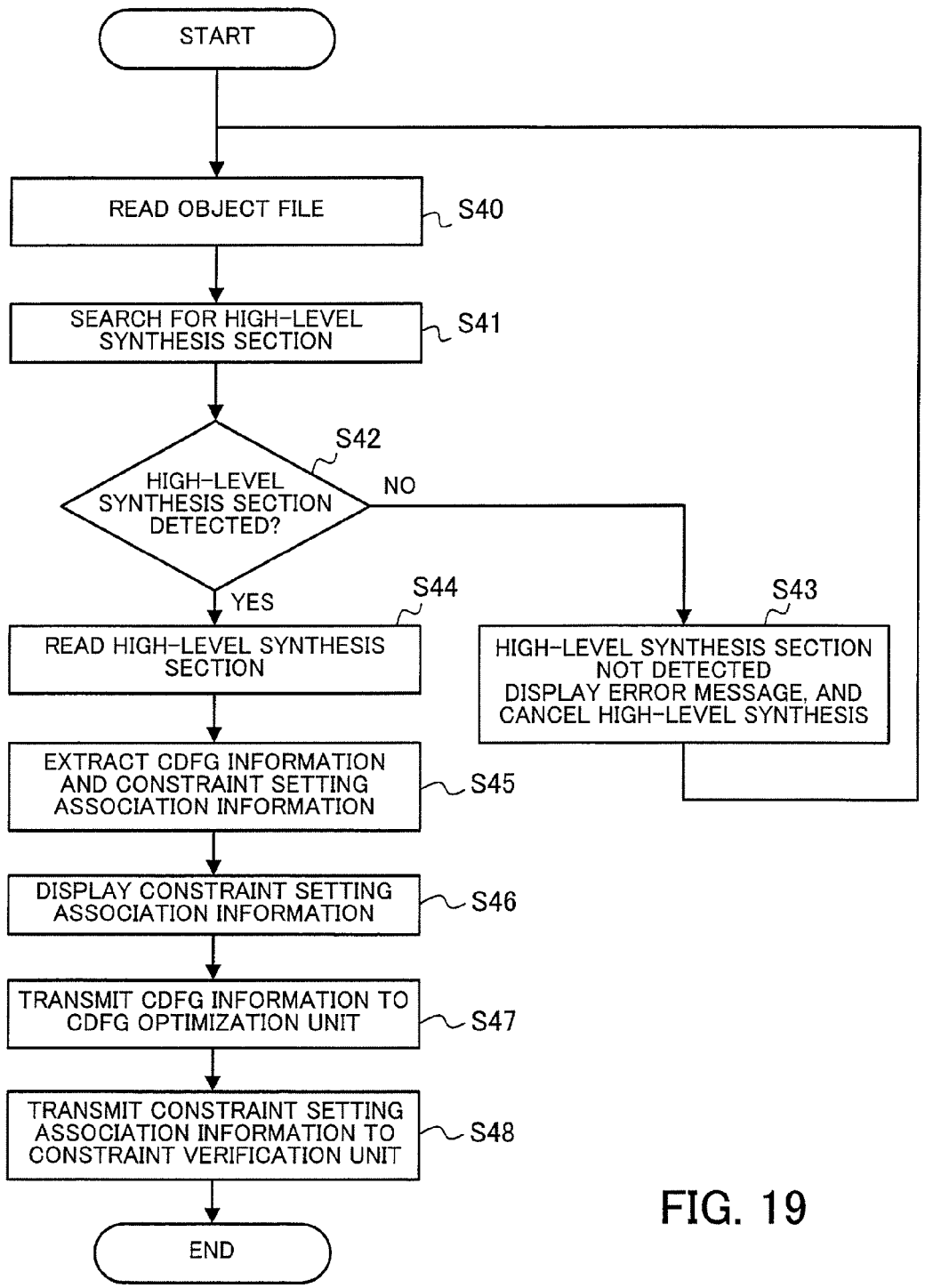
FIG. 19 is a flowchart illustrating an example of an extraction process by an extraction unit of the high-level synthesis apparatus.

FIG. 19 is a flowchart illustrating an example of an extraction process by the extraction unit 20 of the high-level synthesis apparatus 11.

The extraction unit 20 reads the object file D9 generated by the high-level synthesis data generation apparatus 1 (step S40), and searches for a high-level synthesis section in the read object file D9 (step S41). Then, the extraction unit 20 determines whether a high-level synthesis section is detected (step S42). When no high-level synthesis section is detected, the extraction unit 20 causes, for example, the monitor 34*a*, to display an error message indicating that no high-level synthesis section is detected. Thus, execution of high-level synthesis by the high-level synthesis unit 21 is cancelled, and the process returns to step S40.

When the extraction unit 20 detects a high-level synthesis section, the extraction unit 20 reads the high-level synthesis section (step S44), and extracts the CDFG information D2 and the constraint setting association information D6 included in the high-level synthesis section (step S45). The extraction unit 20 causes, for example, the monitor 34*a*, to display the extracted constraint setting association information D6 (step S46). Further, the extraction unit 20 transmits the CDFG information D2 to the CDFG optimization unit 21*b* (step S47), and transmits the constraint setting association information D6 to the constraint verification unit 21*a* (step S48). Thus, the execution process ends. Note that steps S46 through S48 may be performed in any order.

As mentioned above, the high-level synthesis apparatus 11 serving as a user-side apparatus is not provided with the source code D1 itself, but is provided with the object file D9 to which the CDFG information D2 converted from the source code D1 is added. Therefore, the corresponding relationship between the source code D1 and the CDFG information D2 is not identified with regard to items such as loop information, conditional branch, and so on.

However, in the high-level synthesis apparatus 11 of the present embodiment, it is possible to present the constraint setting association information D6 of FIG. 14 to the user, which allows the user to freely set high-level synthesis constraints. Further, as illustrated in FIG. 14, since the setting items are given names by the provider, the user is able to determine what the setting items are about, without the source code D1.

The following describes an example of processing by the constraint verification unit 21*a* of the high-level synthesis apparatus 11.

Figure 20:
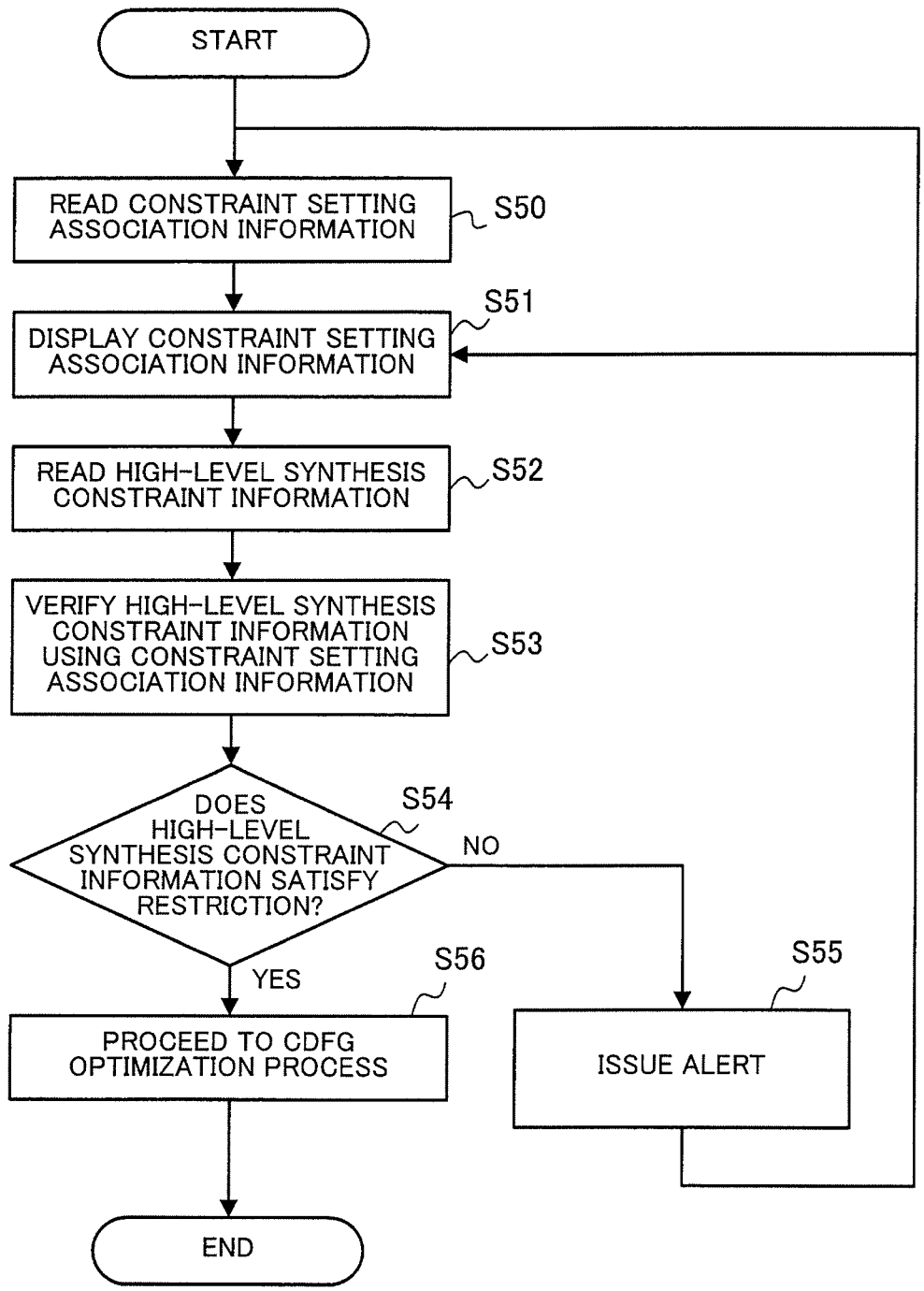
FIG. 20 is a flowchart illustrating an example of a constraint verification process by a constraint verification unit of the high-level synthesis apparatus.

FIG. 20 is a flowchart illustrating an example of a constraint verification process by the constraint verification unit 21*a* of the high-level synthesis apparatus 11.

The constraint verification unit 21*a* reads the constraint setting association information D6 transmitted from the extraction unit 20 (step S50), and causes, for example, the monitor 34*a*, to display the constraint setting association information D6 (step S51). Note that in the case where the constraint setting association information D6 is displayed upon the processing by the extraction unit 20 in step S46 of FIG. 19, the processing of step S51 may be omitted.

Then, the constraint verification unit 21*a* reads the high-level synthesis constraint information (high-level synthesis design information) D11 (step S52), and verifies the high-level synthesis constraint information (high-level synthesis design information) D11 using the constraint setting association information D6 (step S53).

Then, the constraint verification unit 21*a* determines whether the high-level synthesis constraint information (high-level synthesis design information) D11 satisfies restrictions defined by the restriction information (design condition information) D4 included in the constraint setting association information D6 (step S54).

If the high-level synthesis constraint information (high-level synthesis design information) D11 entered by the user does not satisfy the restrictions, the constraint verification unit 21*a* issues an alert (step S55). For example, in the case where the operating frequency is limited to 50 to 200 MHz as illustrated in FIG. 13, if the operating frequency specified in the high-level synthesis constraint information (high-level synthesis design information) D11 is 250 MHz, the constraint verification unit 21*a* issues an alert.

In the processing of step S55, the constraint verification unit 21*a* causes, for example, the monitor 34*a* to display an alert (an error message) so as to prompt the user to change the settings of the high-level synthesis constraint information (high-level synthesis design information) D11 (step S55). Then, the process returns to step S50. If the content of the high-level synthesis constraint information (high-level synthesis design information) D11 entered by the user is correct, the process proceeds to a CDFG optimization process (step S56). Thus, the constraint verification process ends.

Then, high-level synthesis is performed by the CDFG optimization unit 21*b*, the library processing unit 21*c*, the allocation unit 21*d*, the scheduling unit 21*e*, the binding unit 21*f*, the FSMD generation unit 21*g*, and the HDL generation unit 21*h*, which are described above. HDL data D13 generated by the HDL generation unit 21*h* is provided to downstream tools such as a logic synthesis tool and so on, so that mask data of a semiconductor device to be designed is generated.

With the processing by the high-level synthesis apparatus 11 described above, it is possible to perform high-level synthesis based on the CDFG information D2 included in the high-level synthesis section of the object file D9.

Further, the constraint setting association information D6 included in the high-level synthesis section of the object file D9 is output and presented to the user. This allows the user to easily determine what high-level synthesis constraint may be set for the elements of the CDFG information D2.

Further, when the high-level synthesis constraint information (high-level synthesis design information) D11 does not satisfy the restrictions defined by the restriction information (design condition information) D4, the constraint verification unit 21*a* issues an alert, and prevents execution of a CDFG optimization process so as to restrict execution of high-level synthesis. This prevents high-level synthesis from being performed with settings not intended by the provider.

The high-level synthesis data generation apparatus, the high-level synthesis apparatus, the high-level synthesis data generation method, and the program according to the present disclosure have been described with reference to the embodiments. However, these are merely examples, and the present disclosure is not limited thereto.

In the above description, it is assumed that C, C++, or SystemC is used as a high-level language. However, other high-level languages (for example, Java and so on) may be used.

Further, in the above description, the file format of the assembly code and the object file is ELF. However, the file format is not limited to ELF. Any file format including an area to which the user may add information may be used.

Further, in the above description, the intermediate data generation apparatus 5 creates an object file as intermediate data. However, the high-level synthesis data generation apparatus 1 may generate an object file D8 by performing compiling and assembling.

Further, high-level synthesis section information may be encrypted and incorporated in the object file D8.

With the high-level synthesis data generation apparatus, the high-level synthesis apparatus, the high-level synthesis data generation method, and the program according to the present disclosure, it is possible to prevent outflow of know-how.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A high-level synthesis data generation apparatus comprising:
   a processor configured to perform a process including:
   analyzing a source code that represents design data of a semiconductor device, and generating flow information that indicates a data and control flow of the semiconductor device on the basis of analysis of the source code,
   extracting design information that is configurable high-level synthesis design information from the source code,
   acquiring design condition information that indicates a setting condition on the design information from outside the high-level synthesis data generation apparatus,
   generating association information that associates the design condition information with the flow information,
   acquiring first intermediate data obtained by compiling the source code,
   generating second intermediate data by selecting a first section being ignored during a creation process of a executable format file from a plurality of sections in the first intermediate data and by incorporating the flow information and the association information into the first section, and
   outputting the second intermediate data as high-level synthesis data.

2. The high-level synthesis data generation apparatus according to claim 1, wherein the design condition information includes library information used for high-level synthesis.

3. The high-level synthesis data generation apparatus according to claim 1, wherein the design condition information includes a condition value of an operating frequency of the semiconductor device.

4. The high-level synthesis data generation apparatus according to claim 1, wherein the design condition information includes a setting value of pipeline processing performed in the semiconductor device.

5. The high-level synthesis data generation apparatus according to claim 1, wherein the design condition information includes a setting value of parallel processing performed in the semiconductor device.

6. A high-level synthesis apparatus comprising:
   a processor configured to perform a process including:
   acquiring second intermediate data that includes first intermediate data incorporating flow information and association information associating design condition information with the flow information in a first section of the first intermediate data, the first section being ignored during a creation process of a executable format file, and extracting the flow information and the association information from the first section, the first intermediate data being obtained by compiling a source code that represents design data of a semiconductor device, the flow information indicating a data and control flow of the semiconductor device, the design condition information indicating a setting condition on design information, the design information being configurable high-level synthesis design information,
   outputting the association information,
   acquiring the design information from outside the high-level synthesis apparatus, and verifying whether the design information satisfies a condition defined by the design condition information,
   issuing an alert and restricting execution of high-level synthesis, when the high-level synthesis design information does not satisfy the condition, and
   performing the high-level synthesis based on the extracted flow information.

7. A high-level synthesis data generation method comprising:
   analyzing, by a processor, a source code that represents design data of a semiconductor device, and generating flow information that indicates a data and control flow of the semiconductor device on the basis of analysis of the source code,
   extracting, by the processor, design information that is configurable high-level synthesis design information from the source code,
   acquiring, by the processor, design condition information that indicates a setting condition on the design information from outside the high-level synthesis data generation apparatus,
   generating, by the processor, association information that associates the design condition information with the flow information,
   acquiring, by the processor, first intermediate data obtained by compiling the source code,
   generating, by the processor, second intermediate data by selecting a first section being ignored during a creation process of a executable format file from a plurality of sections in the first intermediate data and by incorporating the flow information and the association information into the first section, and
   outputting, by the processor, the second intermediate data as high-level synthesis data.

* * * * *